(12) United States Patent
Kobbe et al.

(10) Patent No.: US 7,250,777 B2
(45) Date of Patent: Jul. 31, 2007

(54) METHOD AND DEVICE FOR MEASURING RESISTANCE

(75) Inventors: Rick Allen Kobbe, Powell Butte, OR (US); Florian G. Bell, Bend, OR (US); Donna K. Barton, Bend, OR (US)

(73) Assignee: Mini-Mitter Co., Inc., Bend, OR (US)

( * ) Notice: Subject to any disclaimer, the term of this patent is extended or adjusted under 35 U.S.C. 154(b) by 0 days.

(21) Appl. No.: 11/391,944

(22) Filed: Mar. 28, 2006

(65) Prior Publication Data

US 2006/0250145 A1 Nov. 9, 2006

Related U.S. Application Data

(60) Provisional application No. 60/666,847, filed on Mar. 30, 2005.

(51) Int. Cl.
*G01R 27/08* (2006.01)

(52) U.S. Cl. ........................ 324/712; 324/691

(58) Field of Classification Search ................. 324/712
See application file for complete search history.

(56) References Cited

U.S. PATENT DOCUMENTS

| | | | |
|---|---|---|---|
| 3,875,503 A * | 4/1975 | Hayashi | 324/712 |
| 4,117,722 A * | 10/1978 | Helmstetter | 374/171 |
| 4,150,573 A | 4/1979 | Iinuma et al. | |
| 4,464,067 A | 8/1984 | Hanaoka | |
| 4,598,270 A * | 7/1986 | Shutt et al. | 324/99 D |
| 4,602,871 A | 7/1986 | Hanaoka | |
| 4,689,621 A | 8/1987 | Kleinberg | |
| 4,814,692 A * | 3/1989 | Baumann | 324/711 |
| 4,844,076 A | 7/1989 | Lesho et al. | |
| 5,886,586 A * | 3/1999 | Lai et al. | 327/176 |
| 6,629,776 B2 | 10/2003 | Bell et al. | |
| 6,930,495 B1 * | 8/2005 | Blom et al. | 324/712 |

* cited by examiner

*Primary Examiner*—Andrew H. Hirshfeld
*Assistant Examiner*—Timothy J. Dole
(74) *Attorney, Agent, or Firm*—Richard J. Coldren

(57) ABSTRACT

A device for measuring a resistance includes a comparator. A D-type flip-flop has its D input connected to the output of the comparator and its latch input connected for receiving a pulse signal at a fixed pulse repetition rate. A reference voltage source is connected to a first of the inputs of the comparator and an integrator is coupled between an output of the flip-flop and the second of the two inputs of the comparator. The integrator includes a resistor whereby the integrator develops a voltage at the second input of the comparator that depends on the pulse repetition rate and on the resistance of the resistor. The comparator, the integrator and the flip-flop are connected in a negative feedback loop such that at steady state the voltage developed by the integrator at the second input of the comparator is substantially equal to the reference voltage.

14 Claims, 1 Drawing Sheet

METHOD AND DEVICE FOR MEASURING RESISTANCE

CROSS-REFERENCE TO RELATED APPLICATION

This application claims benefit of Provisional Application No. 60/666,847 filed Mar. 30, 2005, the entire disclosure of which is hereby incorporated by reference herein for all purposes.

BACKGROUND OF THE INVENTION

The present invention relates to a method and device for measuring resistance and is particularly applicable to an electronic thermometer employing a thermistor as a temperature sensitive element. Such a thermometer may be used for measuring body temperature of a human or animal subject or for measuring ambient temperature.

It is known to utilize a temperature-dependent resistive element together with an oscillator circuit to form a digital thermometer. In the prior art, a thermistor is sometimes used as a temperature-dependent, variable-resistance element in series with a charging capacitor to form the frequency-controlling elements of the oscillator network. The equation $$f = \frac{1}{2\pi RC}$$

determines the frequency of oscillation, where R is the resistance of the resistive element (thermistor) and C is the capacitance of the series charging capacitor. As the temperature varies, the resistance of the thermistor varies, and the frequency varies as a result. By measuring the frequency, and knowing the value of the capacitance, the value of R can be determined. Because R is uniquely related to temperature, the temperature can be determined as well. For a thermistor, the resistance is related to the temperature via the Steinhart-Hart equation. The use of a multivibrator as the oscillator circuit is disclosed in U.S. Pat. No. 4,359,285 by Washburn for low-power oceanographic applications. U.S. Pat. Nos. 4,602,871 and 4,464,067 issued to Hanaoka disclose thermometers based on thermistor-controlled oscillators whose properties emphasize miniaturization, light weight, and improved accuracy using correcting circuits. These latter two patents refer to applications wherein the sensor may be used with low-power wristwatch devices.

One disadvantage of measuring the frequency of the oscillator is that one must know the value of the capacitor extremely accurately in order to derive the value of the resistance accurately. Generally, it is difficult to do capacitance measurements accurately, and in addition, the capacitance value is known to be a temperature-dependent parameter. The capacitance can increase or decrease with changing temperature and the degree of change is related to the exact type of material used in the capacitor (Y5V, X7R, NPO, etc.). A further disadvantage of this approach is that the active circuit elements in the oscillator circuit can themselves have temperature-dependencies. These dependencies are nearly impossible to predict and may vary from circuit to circuit.

Some attempts have been made to reduce the undesirable temperature dependencies by way of calibration techniques. As an example of prior art, U.S. Pat. No. 4,150,573 discloses the use of a thermistor to control a pulse oscillator circuit. In that patent, the pulse oscillator input is switched between the thermistor and a fixed resistor. A ratio is formed between the frequency produced by the thermistor and the frequency produced by the fixed resistor. This ratio divides out uncertainties associated with circuit component values and power supply variations. This provides the advantage of reducing the need for high accuracy parts and reduces the effects of power supply variations. However, this approach is unnecessarily complicated and it does not accurately measure the non-ideal behavior of the oscillator circuit nor does it null out temperature dependencies in the active components of the oscillator circuit. This approach may also introduce errors due to the temperature variations in the switching device.

For a medical thermometer, or other applications where extreme accuracy is required (less than 0.25 degrees C. uncertainty), the errors that are introduced by capacitance variation and by active circuit element variation must be minimized. In addition, for a low-power application such as an ingestible temperature sensor, it is not possible to use sophisticated, computer-controlled correction techniques, because the thermometer must be miniature, and is expected to be powered from a 1.5 volt battery source or a 3.0 volt battery source.

At present there are ingestible temperature responsive transmitters or ingestible temperature monitoring pills available. U.S. Pat. No. 4,689,621 issued to Kleinberg, and U.S. Pat. No. 4,844,076 issued to Lesho et al describe temperature responsive transmitters for use in ingestible capsules. Both devices disclosed employ crystal-controlled oscillators which transmit continuously on a single frequency determined by the temperature of the device. Lesho et al. also discloses a receiver employing a frequency counter to determine the frequency of the transmitter, and perform the calculation to determine the temperature sensed by the pill. Limitations of these prior art ingestible thermometer designs have been articulated in U.S. Pat. No. 6,629,776 (Bell, et al.), in which a highly accurate method of measuring temperature is disclosed.

A known technique for measuring the ratio of an unknown voltage to a known voltage employs the so-called sigma-delta converter. A sigma-delta converter consists of two essential functional parts: an integrator-summer ($\Sigma$) and a comparator ($\Delta$). In a conventional $\Sigma$-$\Delta$ ADC, a comparator compares an unknown voltage and a voltage generated by a digital pulse and integrated through a lowpass filter. The output of the comparator is latched into a D-flip flop and the inverted output of the D-flip flop forms the next digital pulse that is provided to the lowpass filter. If the output of the comparator is a logic 1 (high), the output pulse is negative rail. If the output of the comparator is a logic 0 (low), the output pulse is positive rail. Inverting the output of the D-flip flop provides negative feedback. The digital pulses are integrated by the lowpass filter resulting in a steady-state voltage which is equal to the unknown voltage. A fixed number of pulses is generated, and the number of 1's counted. The ratio of the number of 1's to the total number of pulses is the same as the ratio of the unknown voltage to the total voltage swing (positive minus negative rail voltages).

SUMMARY OF THE INVENTION

According to a first aspect of the present invention there is provided a device for measuring a resistance, comprising a comparator having an inverting input, a non-inverting input and an output, a flip-flop having a D input connected to the output of the comparator, a latch input for receiving a pulse signal at a fixed pulse repetition rate, and a Q output, the flip-flop being responsive to a pulse applied to the latch input to provide a signal level corresponding to the signal level at its D input to its Q output, a means for determining a proportion of time for which the Q output of the flip-flop is at the signal level corresponding to a first signal level at its D input, a reference voltage source connected to a first of the inputs of the comparator, and an integrator coupled between an output of the flip-flop and the second of the two inputs of the comparator, the integrator including a resistor whereby the integrator develops a voltage at the second input of the comparator that depends on said pulse repetition rate and on the resistance of said resistor, and wherein the comparator, the integrator and the flip-flop are connected in a negative feedback loop such that at steady state the voltage developed by the integrator at the second input of the comparator is substantially equal to the reference voltage.

According to a second aspect of the present invention there is provided a method of measuring resistance, comprising providing a circuit comprising a comparator having an inverting input, a non-inverting input and an output, a flip-flop having a D input connected to the output of the comparator, a latch input for receiving a pulse signal at a fixed pulse repetition rate, and a Q output, the flip-flop being responsive to a pulse applied to the latch input to provide a signal level corresponding to the signal level at its D input to its Q output, a means for measuring the proportion of time for which the output signal of the comparator is in a first logic state, a reference voltage source connected to a first of the inputs of the comparator, and an integrator connected between an output of the flip-flop and the second of the two inputs of the comparator, the integrator including a resistor whereby the integrator develops at the second input of the comparator a voltage that depends on said pulse repetition rate and on the resistance of said resistor, and wherein the comparator, the flip-flop and the integrator are connected in a negative feedback loop, such that at steady state the voltage developed by the integrator at the second input of the comparator is substantially equal to the reference voltage, connecting the resistor between the second input of the comparator and a relatively positive potential level and measuring a first value of said proportion, and connecting the resistor between the second input of the comparator and a relatively negative potential level and measuring a second value of said proportion.

According to a third aspect of the present invention there is provided a circuit for measuring a resistance, comprising a comparator having an inverting input, a non-inverting input and an output, a flip-flop having a D input connected to the output of the comparator, a latch input for receiving a pulse signal at a fixed pulse repetition rate, a Q output, and a /Q output, the flip-flop being responsive to a pulse applied to the latch input to provide a signal level corresponding to the signal level at its D input to its Q output and to provide an inverse of that corresponding signal level to its /Q output, a pulse counter connected to a first of the outputs of the flip-flop for counting pulses produced at said first output, a reference voltage source connected to a first of the inputs of the comparator, and an integrator connected between the second of the two outputs of the flip-flop and the second of the two inputs of the comparator, the integrator including a resistor whereby the integrator develops a voltage at the second input of the comparator that depends on said pulse repetition rate and on the resistance of said resistor, and wherein the comparator, the flip-flop and the integrator are connected in a negative feedback loop whereby the voltage developed by the integrator at the second input of the comparator is substantially equal to the reference voltage, whereby the number of pulses counted by the pulse counter in a fixed interval is proportional to the resistance of said resistor.

BRIEF DESCRIPTION OF THE DRAWINGS

For a better understanding of the invention, and to show how the same may be carried into effect, reference will now be made, by way of example, to the accompanying drawings, in which.

DETAILED DESCRIPTION

Figure 1:
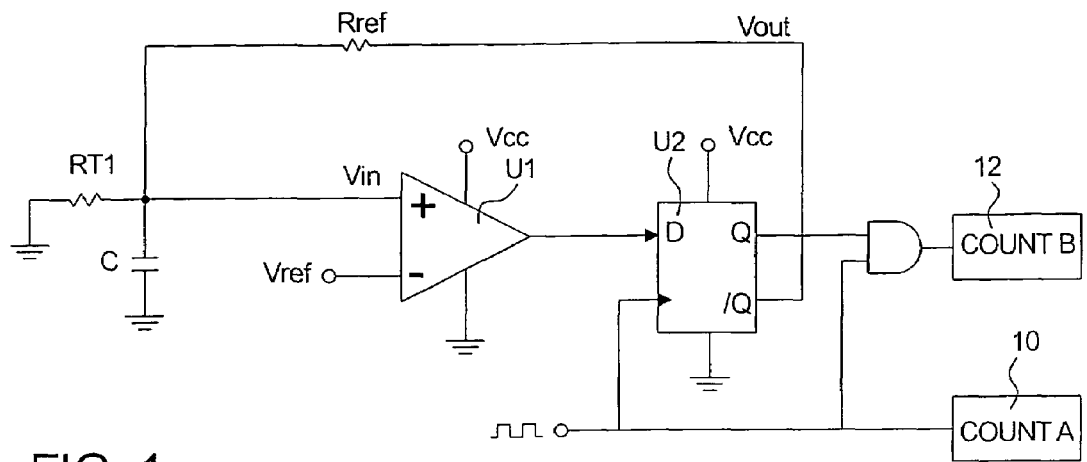
FIG. 1 is a schematic diagram illustrating a first circuit for measuring resistance.

FIG. 1 illustrates a first embodiment of the invention comprising a comparator U1 and a D flip-flop U2. A clock signal CLK having a fixed pulse repetition rate latches the output of the comparator into the flip-flop. The /Q output of the flip-flop is connected to the non-inverting input of the comparator through a resistor Rref. A thermistor RT1 and a capacitor C are connected in parallel between the non-inverting input of the comparator and the negative rail (ground). The resistor Rref, thermistor RT1 and capacitor C form an integrator connected between the /Q output of the flip-flop and the non-inverting input of the comparator. The inverting input of the comparator is connected to a fixed threshold voltage Vref. The integrator and the comparator form a sigma-delta converter.

The clock pulses are counted (COUNT A) by a counter 10. The clock signal CLK is also applied to one input of an AND gate, whose other input is connected to the Q output of the flip-flop U2. When the Q output of the flip-flop is low, the clock pulses are blocked by the AND gate, but when the Q output of the flip-flop is high, the clock pulses are passed by the AND gate and are counted (COUNT B) by a counter 12. The number of pulses counted by the counter 12 in a fixed interval divided by the number of pulses counted by the counter 10 in the same interval is the proportion of time for which the output signal of the comparator is in the logic true state and is referred to herein as the measurement ratio.

If the voltage Vin at the non-inverting input of the comparator is greater than the threshold voltage Vref, the comparator provides a logic true output, which is latched into the flip-flop. The Q output of the flip-flop goes high and the counter 12 starts counting the clock pulses. The /Q output of the flip-flop goes low and the capacitor C discharges, and the voltage Vin falls, until the voltage Vin is lower than the threshold voltage. The comparator then provides a logic false output which is latched into the flip-flop by the next clock pulse. The Q output of the flip-flop goes low and the counter 12 stops counting the clock pulses. The /Q output of the flip-flop goes high and the capacitor C charges, and the voltage Vin rises, until the voltage Vin is higher than the threshold voltage and the comparator again provides a logic true output. If the resistance of the thermistor is constant, after several repetitions of this sequence a steady state is attained in which the voltage Vin is equal to Vref.

At steady state:

$$Vin = Vout*(RT1/(Rref+RT1))$$

and the mean value of Vout over an integer number of repetitions of the above sequence is equal to Vcc*Nlo, where Nlo is the measurement ratio for the circuit configuration shown in FIG. 1. Substituting for Vin and Vout:

$$Vref = Vcc*Nlo*(RT1/(Rref+RT1))$$

Solving for RT1:

$$RT1 = Vref*Rref/(Vcc*Nlo-Vref)$$

Thus, if Vref, Rref and Vcc are known and we measure Nlo, it is straightforward to obtain the resistance of the thermistor.

Figure 2:
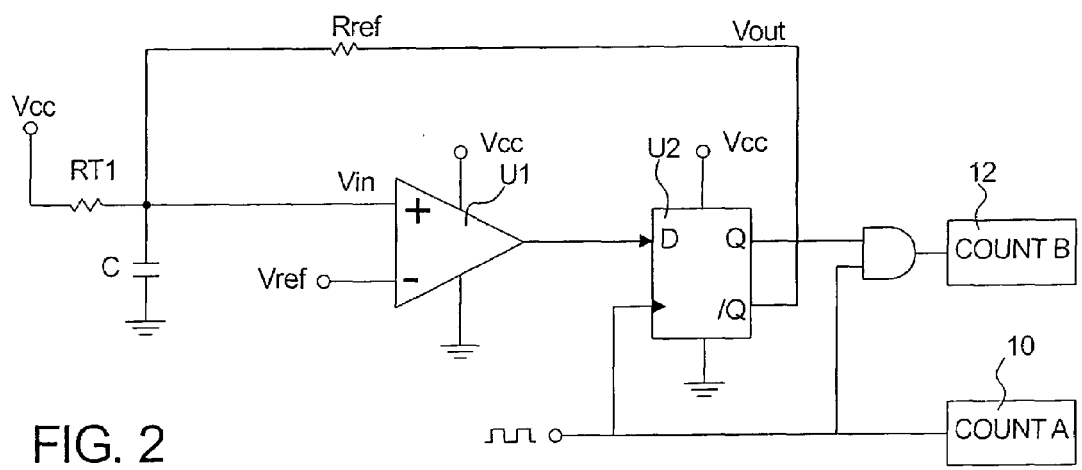
FIG. 2 is a schematic diagram illustrating a second circuit for measuring resistance.

FIG. 2 illustrates a second embodiment of the invention, in which the thermistor RT1 is connected to Vcc. The mode of operation is similar to that of the FIG. 1 embodiment, and in this case we denote the measurement ratio as Nhi. At steady state:

$$Vin = ((Vcc-Vout)*(Rref/(Rref+RT1))) + Vout$$

and the mean value of Vout over an integer number of repetitions of the above sequence is equal to Vcc*Nhi. Substituting for Vin and Vout:

$$Vref = ((Vcc-Vcc*Nhi)*(Rref/(Rref+RT1))) + Vcc*Nhi$$

Solving for RT1:

$$RT1 = Rref(Vcc-Vref)/(Vref-Vcc*Nhi)$$

Again, it is straightforward to obtain the resistance of the thermistor.

The circuits that are illustrated functionally in FIGS. 1 and 2 may be implemented in a commercially available microcontroller using firmware that is appropriately programmed to perform the necessary functions. A preferred microcontroller is a microcontroller of the MSP430x11x1 series from Texas Instruments, since the microcontrollers of that series include a comparator.

The circuits shown in FIGS. 1 and 2 are subject to a number of potential measurement errors. In particular, since the unknown voltage Vin is compared to a fixed threshold voltage, any error in the fixed threshold voltage Vref supplied to the comparator will result in measurement error. One potential source of error in the threshold voltage Vref is caused by changes in the supply voltage and the associated positive rail voltage Vcc.

A second potential error is the common mode offset voltage in the comparator. It is known that this error may be eliminated by switching the inputs and the output polarity of the comparator half-way through the measurement. Thus, both the circuit shown in FIG. 1 and that shown in FIG. 2 may be compensated for common mode offset voltage by making each measurement in two halves. In the first half the measurement ratio Nlo or Nhi is measured with the comparator connected as shown and in the second half the inputs to the comparator are reversed and the output of the comparator is inverted. By taking the mean of the two values of Nlo or Nhi the measurement ratio is corrected for common mode offset error.

A third potential error in the threshold voltage Vref is the variation in the threshold voltage Vref from device to device. Other devices using the Σ-Δ ADC use calibration as a means to eliminate this error. In the preferred embodiment of the present invention, shown in FIG. 3, the error is eliminated by switching between the two functional configurations shown in FIGS. 1 and 2 respectively. Thus, referring to FIG. 3 a switch SW1 is first set to configure the microcontroller to function as shown in FIG. 1, and the ratio Nlo is measured. The switch SW1 is then set to tie the thermistor to the positive rail, as shown in FIG. 2, and the ratio Nhi is measured. Each measurement includes switching of the comparator inputs and output polarity to compensate for common mode offset error, as described above.

In this case, we use a different approach to calculating RT1. Let us define the ratio of reference voltage Vref to positive rail Vcc as x. In the case of the FIG. 1 configuration:

$$x = Nlo*(RT1/(Rref+RT1))$$

and in the case of the FIG. 2 configuration:

$$x = ((1-Nhi)*(Rref/(Rref+RT1))) + Nhi$$

Since the reference voltage ratio (x) is the same whether the thermistor is tied to ground or to the positive rail, we can equate the two equations for x and solve for RT1:

$$Nlo*(RT1/(Rref+RT1)) = ((1-Nhi)*(Rref/(Rref+RT1))) + Nhi$$

$$RT1*Nlo = (Rref*(1-Nhi)) + ((Rref+RT1)*Nhi)$$

$$RT1 = Rref/(Nlo-Nhi)$$

Thus, if we know Rref and measure Nlo and Nhi, we can calculate RT1.

Figure 3:
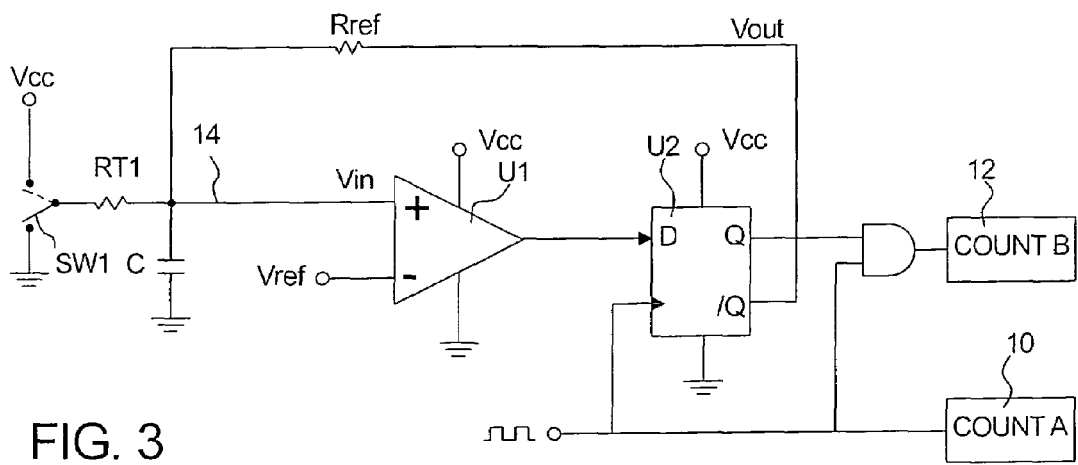
FIG. 3 is a schematic diagram illustrating a third circuit for measuring resistance.

The approach that is used in calculating RT1 in the case of FIG. 3 assumes that the ratio x does not change, but as noted above it is possible for the threshold voltage Vref to change if the supply voltage changes. In addition, the ratio x may change due to temperature and ageing. Therefore in general we cannot validly assume that the ratio x does not change from measurement to measurement. However, changes in x due to temperature, ageing and supply voltage would generally take place over a time longer than the measurement interval, which is typically less than one second, and consequently in practice we can equate the two expressions for x. Furthermore, in the preferred microcontroller, mentioned above, the threshold voltage Vref and positive rail Vcc shift as a fixed ratio with the supply voltage and so even if the supply voltage changes suddenly, the ratio of Vref to Vcc, i.e. x, is not affected by the change.

The difference between the two complete measurements of Nlo and Nhi respectively removes the comparator reference offset, including any comparator reference temperature coefficient effects.

A complete measurement involves four full cycles. There are two measurements of Nlo (thermistor connected to ground), first with the comparator output polarity positive, circuit node 14 connected to the non-inverting input and Vref connected to the inverting input, as shown, and then with the comparator output polarity negative, the circuit node 14 connected to the inverting input and Vref connected to the non-inverting input. And there are two measurements of Nhi (thermistor connected to VCC), first with the comparator output polarity positive, the circuit node 14 connected to the non-inverting input and Vref connected to the inverting input, and then with the comparator output polarity negative, the node 14 connected to the inverting input and Vref connected to the non-inverting input.

At the beginning of each cycle of the measurement, the input pin connected to the capacitor is programmed as an output pin and pulled low, allowing the capacitor to discharge. This forces all measurement cycles to begin from the same starting point, 0 VDC.

Once the resistance of the thermistor is known, the corresponding temperature can be determined. For a thermistor, the thermal function is uniquely related to the temperature via the Steinhart-Hart equation:

$$\frac{1}{T} = a + b\ln(R) + c[\ln(R)]^3$$

whose coefficients a, b, and c are constants and characteristic of the material used to manufacture the thermistor. For highest accuracy, a medical-grade thermistor is used which has a high degree of repeatability from part to part, and whose resistance-to-temperature relationship is very accurately known and provided by the supplier of the thermistor.

The resistance is scaled by the reference resistor (Rref) and entered in a lookup table in 1 degree Celsius steps. A table search finds the integer part of the temperature and linear interpolation between table points finds the fractional portion of the measurement.

In a practical implementation, the thermometer is able to measure temperature over a 25° C. range, from +25° C. to +50° C., with an accuracy of +/−0.1° C.

In the preferred embodiment of the thermometer, the resistive element (thermistor) and the microcontroller form a miniature, low-cost, battery-operated thermometer that requires no calibration and is useful for ambulatory human or animal temperature measurement. By incorporating the temperature-sensitive resistive element into the Σ-Δ ADC and implementing the remaining functions in a microcontroller, a minimum number of parts and power is used while maintaining a very high degree of conversion accuracy. The thermometer can be made small enough to fit into an ingestible pill for measuring body core temperature, in a small skin patch for measuring skin temperature, in a capsule that can be placed in a body orifice, such as the ear canal, or implanted elsewhere in a human or animal subject, or in the form of a small transmitter for use in measuring ambient temperature.

It will be appreciated that the invention is not restricted to the particular embodiments that have been described, and that variations may be made therein without departing from the scope of the invention as defined in the appended claims and equivalents thereof. For example, although the invention has been described with reference to a sigma-delta converter implemented by a general purpose microcontroller, in other embodiments the sigma-delta converter may be implemented by separate functional components. Unless the context indicates otherwise, a reference in a claim to the number of instances of an element, be it a reference to one instance or more than one instance, requires at least the stated number of instances of the element but is not intended to exclude from the scope of the claim a structure or method having more instances of that element than stated.

The invention claimed is:

1. A device for measuring a resistance, comprising:
   a comparator having an inverting input, a non-inverting input and an output,
   a flip-flop having a D input connected to the output of the comparator, a latch input for receiving a pulse signal at a fixed pulse repetition rate, and a Q output, the flip-flop being responsive to a pulse applied to the latch input to provide a signal level corresponding to the signal level at its D input to its Q output,
   a means for determining a proportion of time for which the Q output of the flip-flop is at the signal level corresponding to a first signal level at its D input,
   a reference voltage source connected to a first of the inputs of the comparator, and
   an integrator coupled between an output of the flip-flop and the second of the two inputs of the comparator, the integrator including a resistor whereby the integrator develops a voltage at the second input of the comparator that depends on said pulse repetition rate and on the resistance of said resistor,
   and wherein the comparator, the integrator and the flip-flop are connected in a negative feedback loop such that at steady state the voltage developed by the integrator at the second input of the comparator is substantially equal to the reference voltage.

2. A device according to claim 1, wherein the device is a programmable microcontroller and firmware programs the microcontroller to operate alternately in a first configuration in which the resistor is connected between the second input of the comparator and a relatively positive potential level and in a second configuration in which the resistor is connected between the second input of the comparator and a relatively negative potential level.

3. A device according to claim 1, wherein the resistor is a thermistor.

4. A device according to claim 1, wherein the means for determining the proportion of time for which the Q output of the flip-flop is at the signal level corresponding to the first signal level at its D input comprises a first counter for counting the pulses received by the latch input of the flip-flop and a second counter for counting pulses received by the latch input of the flip-flop while the Q output of the flip-flop is at the signal level corresponding to the first signal level at its D input.

5. A device according to claim 1, wherein the reference voltage source is connected to the inverting input of the comparator, the flip-flop has a /Q output, and the integrator is connected between the /Q output of the flip-flop and the non-inverting input of the comparator.

6. A device according to claim 1, wherein the resistor is connected between the second input of the comparator and a positive reference potential level.

7. A device according to claim 1, wherein the resistor is connected between the second input of the comparator and a negative reference potential level.

8. A device according to claim 1, wherein the resistor has one terminal connected to the second input of the comparator, and the device includes a switch for connecting the other terminal of the resistor alternately to a positive reference potential level and a negative reference potential level.

9. A method of measuring resistance, comprising:
   providing a circuit comprising a comparator having an inverting input, a non-inverting input and an output, a flip-flop having a D input connected to the output of the comparator, a latch input for receiving a pulse signal at a fixed pulse repetition rate, and a Q output, the flip-flop being responsive to a pulse applied to the latch input to provide a signal level corresponding to the signal level at its D input to its Q output, a means for measuring the proportion of time for which the output signal of the comparator is in a first logic state, a reference voltage source connected to a first of the inputs of the comparator, and an integrator connected between an output of the flip-flop and the second of the two inputs of the comparator, the integrator including a resistor whereby the integrator develops at the second input of the comparator a voltage that depends on said pulse repetition rate and on the resistance of said resistor, and wherein the comparator, the flip-flop and the integrator are connected in a negative feedback loop, such that at steady state the voltage developed by the integrator at the second input of the comparator is substantially equal to the reference voltage, connecting the resistor between the second input of the comparator and a relatively positive potential level and measuring a first value of said proportion, and connecting the resistor between the second input of the comparator and a relatively negative potential level and measuring a second value of said proportion.

10. A method according to claim 9, wherein the resistor is a thermistor and the method further comprises calculating a temperature value from said first and second values of said proportion.

11. A method according to claim 9, comprising measuring a value of said proportion by counting the pulses received by the latch input of the flip-flop and counting pulses received by the latch input of the flip-flop while the Q output of the flip-flop is at the signal level corresponding to the output of the comparator being in said first logic state.

12. A circuit for measuring a resistance, comprising:
a comparator having an inverting input, a non-inverting input and an output,
a flip-flop having a D input connected to the output of the comparator, a latch input for receiving a pulse signal at a fixed pulse repetition rate, a Q output, and a /Q output, the flip-flop being responsive to a pulse applied to the latch input to provide a signal level corresponding to the signal level at its D input to its Q output and to provide an inverse of that corresponding signal level to its /Q output,
a pulse counter connected to a first of the outputs of the flip-flop for counting pulses produced at said first output,
a reference voltage source connected to a first of the inputs of the comparator, and
an integrator connected between the second of the two outputs of the flip-flop and the second of the two inputs of the comparator, the integrator including a resistor whereby the integrator develops a voltage at the second input of the comparator that depends on said pulse repetition rate and on the resistance of said resistor,
and wherein the comparator, the flip-flop and the integrator are connected in a negative feedback loop whereby the voltage developed by the integrator at the second input of the comparator is substantially equal to the reference voltage, whereby the number of pulses counted by the pulse counter in a fixed interval is proportional to the resistance of said resistor.

13. A circuit according to claim 12, wherein the resistor is a thermistor, whereby the resistance of the thermistor depends on the temperature of the thermistor.

14. A circuit according to claim 12, comprising a second pulse counter for counting pulses applied to the latch input of the flip-flop.

* * * * *